United States Patent [19]
Parks et al.

[11] Patent Number: 5,469,559
[45] Date of Patent: Nov. 21, 1995

[54] METHOD AND APPARATUS FOR REFRESHING A SELECTED PORTION OF A DYNAMIC RANDOM ACCESS MEMORY

[75] Inventors: Terry J. Parks, Round Rock; David S. Register, Austin, both of Tex.

[73] Assignee: Dell USA, L.P., Austin, Tex.

[21] Appl. No.: 88,061

[22] Filed: Jul. 6, 1993

[51] Int. Cl.⁶ ................................................... G06F 12/02
[52] U.S. Cl. .................... 395/433; 364/DIG. 1; 364/246.91; 364/238.4; 365/222
[58] Field of Search .................................. 395/400, 425; 365/222

[56] References Cited

U.S. PATENT DOCUMENTS

| | | | |
|---|---|---|---|
| 4,218,753 | 8/1980 | Hendrie | 365/222 |
| 4,594,656 | 6/1986 | Moffett | 395/425 |
| 4,631,701 | 12/1986 | Kappeler et al. | 395/425 |
| 4,716,460 | 12/1987 | Benson et al. | 358/140 |
| 4,924,441 | 5/1990 | Inskeep | 365/222 |
| 5,129,073 | 7/1992 | Murakami et al. | 395/425 |
| 5,130,923 | 7/1992 | Warriner et al. | 365/240 |
| 5,305,274 | 4/1994 | Proebsting | 362/222 |
| 5,317,709 | 5/1994 | Sugimoto | 395/425 |

Primary Examiner—Eddie P. Chan
Assistant Examiner—Hiep T. Nguyen
Attorney, Agent, or Firm—David McCombs; James Huffman

[57] ABSTRACT

A system for refreshing selected portions of a dynamic access memory (DRAM) subsystem of a computer. A memory controller of the present invention includes a RAM device for storing a plurality of region descriptors used to inhibit the refresh of address ranges of the DRAM that do not contain valid data, thereby conserving energy required to refresh the entire DRAM. The controller includes logic circuitry connected between a refresh period timer and the RAM device for inhibiting receipt by a RAS generator of a refresh pulse when a generated refresh address falls within the refresh address range defined by the region descriptor. A refresh address output by a refresh address counter compared to the region descriptors in the RAM device, and if the region descriptors indicate that the row addressed by the refresh address does not contain valid data, the RAS generator is inhibited from producing a RAS pulse. Logic instructions are inserted into memory allocation and memory deallocation subroutines of the computer's operating system for writing the region descriptors to the RAM device.

20 Claims, 5 Drawing Sheets

METHOD AND APPARATUS FOR REFRESHING A SELECTED PORTION OF A DYNAMIC RANDOM ACCESS MEMORY

CROSS-REFERENCE TO RELATED APPLICATION

The present application is related to copending application Ser. No. 08/088,289 entitled METHOD OF POWER MANAGEMENT FOR RAM SUBSYSTEM, filed on even date herewith, assigned to the assignee of the present application and hereby incorporated by reference as if reproduced in its entirety.

TECHNICAL FIELD

The invention relates generally to memory controllers for personal computers and specifically to a memory controller for refreshing only selected portions of a DRAM subsystem.

BACKGROUND OF THE INVENTION

The many components and peripheral devices of both desktop and portable personal computers (PCs) consume a great deal of power even when they are not active. For this reason, power management systems have been developed which cause each component or peripheral device of a computer to operate in the lowest power consumption mode with respect to present demands thereon. One basic type of power management system commonly implemented on personal computers, especially portables, monitors various peripheral devices for I/O activity. After a predetermined period of I/O inactivity has elapsed, the computer is "powered down", i.e., the system clock is halted and power is removed from the hard disk drive, the floppy disk drive, the liquid crystal display (LCD), and miscellaneous system circuitry, thereby effecting more efficient use of remaining battery power.

More recently, improvements in the basic power management system have been introduced which include options such as blanking the liquid crystal display (LCD) or monitor screen after a predetermined period of I/O inactivity or turning off the hard disk drive motor after the hard disk drive has not been accessed for a predetermined period of time. Furthermore, there may be provided more than one reduced power consumption mode. For example, there may be a "stand by" mode in which certain components, such as the LCD and the hard disk drive motor, are caused to enter a reduced power consumption mode but the processing speed of the central processing unit (CPU) is not affected. In a "sleep" mode, nearly all of the functions of the PC are slowed or halted, including the CPU. From the standpoint of power consumption, the sleep mode is substantially equivalent to turning the PC off, except that no data is lost.

One area of power management that is not currently addressed by available power management systems concerns dynamic random access memory (DRAM) subsystems. DRAMs are composed of an array of memory cells, each of which comprises a transistor network and an intrinsic capacitor. In operation, the transistors are used to charge or discharge the capacitor, depending on whether a "1" or a "0" is to be stored in the cell. It is well known that, in order to maintain the integrity of the data stored in the cells, the cells must be periodically refreshed. Such refreshing may be accomplished by reading each row of the DRAM array into sense amplifiers in the DRAM and then writing the data back into the row, referred to as a "row-only refresh". Refreshing the DRAM subsystem consumes a large amount of power.

For example, a single Toshiba 1 MB× 4 DRAM requires an average refresh current of approximately 100 mA to refresh the entire DRAM. Most PCs require more than one such DRAM, as they must contain an amount of DRAM sufficient to accommodate the largest application program executable on the PC. In most instances, large portions of a DRAM subsystem do not contain valid data and therefore need not be refreshed.

Presently, there is no means for refreshing only those portions of DRAM that contain valid data. For this reason, much battery power is wasted refreshing unused DRAM cells. Because of the large amount of power consumed by DRAM refresh, the total amount of DRAM which may optimally be included in a system is limited by power consumption, rather than architectural, concerns.

Therefore, what is needed is a memory controller for selectively refreshing only those portions of system DRAM that contain valid data.

SUMMARY OF THE INVENTION

The foregoing problems are solved and a technical advance is achieved by apparatus and method for selectively refreshing only those portions of a DRAM subsystem that contain valid data. In a departure from the art, a memory controller of the present invention is provided with a random access memory (RAM) device, for example, a static RAM (SRAM), in which are stored region descriptors for indicating which portions of a DRAM subsystem do not contain valid data and therefore need not be refreshed. The provision of such region descriptors enables the memory controller to save a substantial amount of operating power by refreshing only those portions of the DRAM that contain valid data.

In an illustrative embodiment, the memory controller of the present invention comprises a refresh period timer for generating refresh pulses at periodic intervals, a refresh address counter connected to the refresh period timer for generating refresh addresses to the DRAM subsystem, a RAS generator for generating row address strobe (RAS), or refresh request, pulses to the DRAM for causing the row of DRAM addressed by a refresh address to be refreshed, a RAM device comprising a plurality of region descriptors that define a region, or regions, of DRAM which need not be refreshed, and logic circuitry for assertion of a RAS pulse when the region of the DRAM addressed by the refresh address need not be refreshed. Upon the expiration of a refresh period, the refresh period timer generates a refresh pulse to the refresh address counter. Responsive to receipt of the refresh pulse, the counter outputs a refresh address. The refresh address is compared to the region descriptors in the RAM device and, if the region descriptors indicate that the row addressed by the refresh address contains no valid data, the logic circuitry inhibits receipt of the refresh pulse by the RAS generator. As a result, the RAS generator is inhibited from producing a refresh request and the row addressed by the refresh address is not refreshed. Otherwise, the refresh request is generated to the DRAM as would normally be the case.

In one embodiment, the RAM device comprises a one-dimensional bit map of the DRAM subsystem, with each row of DRAM represented by a one bit region descriptor in the RAM device. In this embodiment, a refresh address output by the refresh address counter is input to the RAM device to index the one bit region descriptor corresponding to the row of DRAM addressed by the refresh address. The indexed bit is output by the RAM device and input to one input of a two input AND gate. The refresh pulse generated by the refresh timer, which normally would be directly input the RAS generator to produce a RAS pulse to the DRAM, is instead input to the other input of the AND gate. The output of the AND gate is then input to the RAS generator. Accordingly, if the indexed bit, or region descriptor, is a 0, indicating that the row addressed by the refresh address contains no valid data, the output of the AND gate will be a 0, inhibiting the RAS generator from receiving the refresh pulse and producing a refresh request, or RAS pulse, to the DRAM. Alternatively, if the indexed bit is a 1, indicating that the row addressed by the refresh address contains valid data, the output of the AND gate will be a 1 and the refresh pulse will be received by the RAS generator as usual.

In an alternative embodiment, the region descriptors of the RAM device comprise start and end addresses which define a region (i.e., several rows) of the DRAM subsystem that need not be refreshed. In the alternative embodiment, the refresh address is compared with each of the region descriptors in the RAM device using a comparator. If the refresh address falls within a region defined by the descriptors, that is, if the refresh address is greater than the start address and less than the corresponding end address, the output of the comparator is such that the RAS generator is inhibited from receiving the refresh pulse and producing a refresh request to the DRAM. Otherwise, the output of the comparator will be such that the refresh pulse will be received by the RAS generator as usual. It is understood that there may be one or more region descriptor of this type, depending on the number of separate regions of DRAM that do not contain valid data.

In one aspect of the invention, a unique set of logic instructions are inserted into the memory allocation and memory deallocation subroutines of the operating system of the computer in which the memory controller is implemented for causing the appropriate region descriptors to be written to the RAM device.

A technical advantage achieved with the invention is that it reduces the overall power consumption of the PC by eliminating the waste of power resulting from unnecessary DRAM refreshes.

A further technical advantage achieved with the invention is that it increases the efficiency of the PC by relieving the CPU and memory controller from performing unnecessary DRAM refreshes.

A further technical advantage achieved with the invention is that it relaxes the limitation on the number of DRAMs which can be optimally included in a DRAM subsystem previously imposed by power consumption concerns.

DETAILED DESCRIPTION OF THE PREFERRED EMBODIMENT

Figure 1:
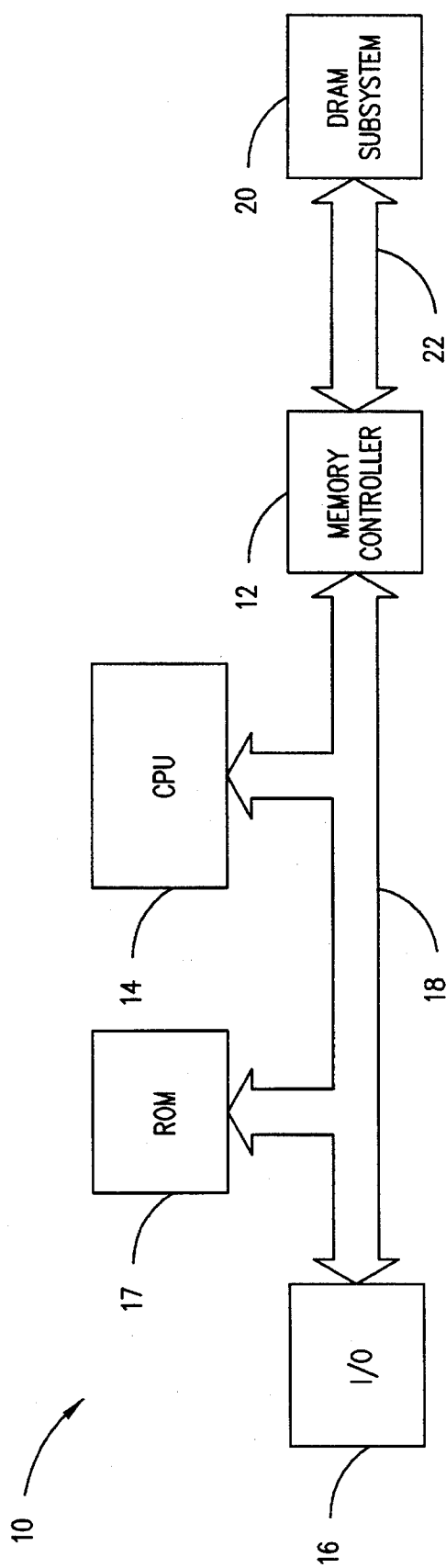
FIG. 1 is a block diagram of a personal computer in which a memory controller embodying features of the present invention is implemented.

Referring to FIG. 1, the reference numeral 10 designates a personal computer system in which a memory controller 12 embodying features of the present invention is implemented. It is understood that, for the purposes of clarity, only a portion of the computer 10 is illustrated in FIG. 1, although it will be understood by those skilled in the art that additional components will ordinarily be included therein. The memory controller 12 is connected to a central processing unit (CPU) 14 and several I/O devices and controllers, collectively designated by the reference numeral 16, and a read only memory (ROM) 17 via a bus 18. The memory controller 12 is also connected to a dynamic random access memory (DRAM) subsystem 20 via a bus 22. It is understood that the buses 18 and 22 carry address data and control signals among the memory controller 12, the CPU 14 and the I/O devices 16 and between the memory controller 12 and the DRAM 20, respectively. As will be subsequently described in detail, the CPU 14 executes a unique set of logic instructions that are stored in the ROM 17 to control the operation of the memory controller 12 in accordance with the present invention.

Figure 2:
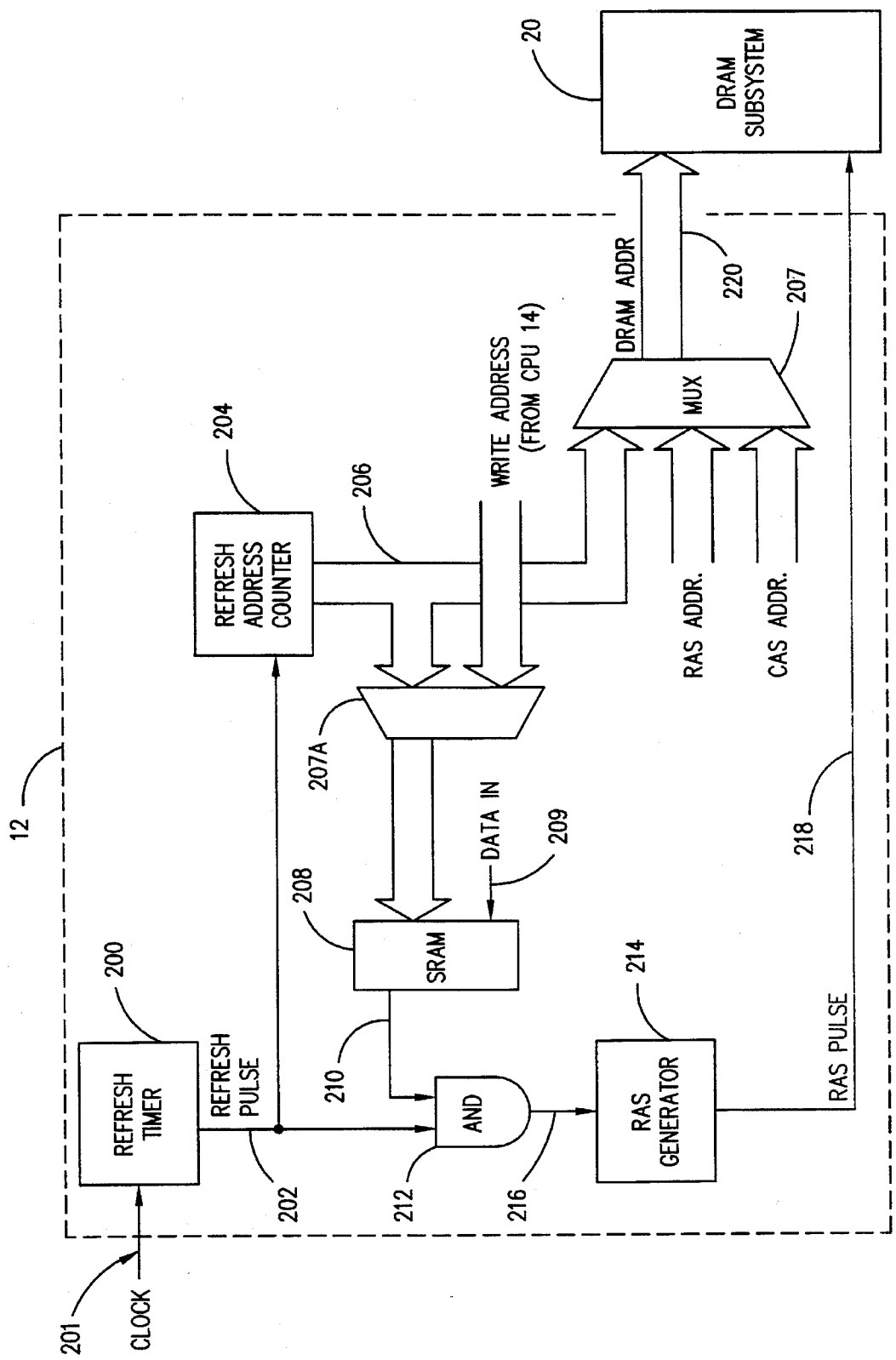
FIG. 2 is a block diagram of the memory controller of FIG. 1.

FIG. 2 illustrates a preferred embodiment of the memory controller 12 of FIG. 1. In this embodiment, the memory controller 12 comprises a refresh timer 200 which is connected to receive clock signals from the system clock (not shown) on a line 201. The timer 200 generates refresh pulses on a line 202 at periodic intervals equal to the refresh period of the DRAM 20, for example, every 15 microseconds. These refresh pulses are input to a refresh address counter 204, which generates the refresh addresses used in refreshing the DRAM subsystem 20. In the present embodiment, a "row-only" (or "RAS-only") type of refresh is implemented and each refresh address addresses a single row of the DRAM subsystem 20.

At power-up of the computer 10, the counter 204 is initialized to the refresh address of the first row of the DRAM 20 (the "initial value"). The counter 204 is incremented responsive to receipt of a refresh pulse from the timer 200 until it has reached the refresh address of the last row of the DRAM 20 (the "maximum value"), at which point it is reinitialized upon receipt of the next refresh pulse. The counter 204 value, i.e., the refresh address, is output on a bus 206 and input to a first multiplexer (MUX) 207 and a second MUX 207A. The MUX 207A also has inputs connected to receive a "write address" from the CPU 14, for purposes which will subsequently be described. The output of the MUX 207A is input as an address to a one bit wide RAM device, such as a static RAM (SRAM) 208.

The SRAM 208 comprises a one-dimensional bit map of the DRAM subsystem 20, wherein each bit of the SRAM 208 corresponds to a row of the DRAM 20. Each bit of the SRAM 208 operates as a "region descriptor" for inhibiting or enabling refresh of the corresponding row of the DRAM 20, depending on whether the row contains valid dam. In the illustrated embodiment, a region descriptor will be a 1 if the corresponding row contains valid data and must be refreshed and a 0 if the corresponding row does not contain valid data and need not be refreshed. The region descriptors are set to the appropriate value (i.e., 0 or 1) by a unique set of logic instructions executed by the CPU 14, which logic instructions are inserted in the memory allocation and deallocation routines of the operating system of the computer 10, which is stored in the ROM 17. It well known to those skilled in the art that every operating system includes some version of these routines, for example, "MALLOC" and "FREE", which are used in both DOS and UNIX operating system. It is also well known that all system memory must be allocated and deallocated with these routines.

Initially, because the DRAM contains no valid data, all of the bits of the SRAM 208 will be set to 0. Each time a row or rows of the DRAM 20 are allocated, the logic instructions inserted in the memory allocation routine cause a binary 1 to be written to the memory location(s) in the SRAM 208 that corresponds to the allocated row(s) of the DRAM 20. Conversely, each time a row or rows of the DRAM 20 are deallocated, the logic instructions inserted in the memory deallocation routine write a binary 0 to the memory location(s) in the SRAM 208 that corresponds to the deallocated row(s) of the DRAM 20. The writing of the region descriptors is accomplished by inputting a write address from the CPU 14 to the MUX 207 A, inputting a binary 1 or 0 from the CPU to the SRAM 208 on a data input line 209, and selecting the write address inputs of the MUX 207A.

As previously indicated, the refresh address generated by the refresh counter 204 is input to the SRAM 208. The address is used to index the region descriptor that corresponds to the row of DRAM 20 addressed by the refresh address. The indexed region descriptor, which, as previously described, will be a 0 or a 1, depending on whether refresh of the addressed row is to be inhibited, is output from the SRAM 208 on a line 210 and input to one input of a two-input AND gate 212. The other input of the AND gate 212 is connected to the output of the refresh timer 200 via the line 202 for receiving refresh pulses therefrom.

In most prior art memory controllers, the refresh pulse from the timer 200 would be directly input to a row address strobe (RAS) generator 214, which generates refresh requests to the DRAM subsystem 20 for effecting a RAS-only refresh. Upon receipt of a refresh pulse, the RAS generator 214 generates a refresh request, in the form of a RAS pulse without a corresponding column address strobe (CAS) pulse, to the DRAM 20 to refresh the row addressed by the refresh address. However, according to a feature of the present invention, rather than being directly input to the RAS generator 214, the refresh pulse is ANDed with the region descriptor output the SRAM 210 via the AND gate 212. The result of this operation is input to the RAS generator 214 via a line 216. Accordingly, if the region descriptor indexed by the refresh address and output on line 210 is a 0, the output of the AND gate 212, will also be a 0 and the RAS generator will not generate a RAS pulse, thereby inhibiting refresh of the addressed row. Conversely, if the region descriptor indexed by the refresh address and output on line 210 is a 1, the output of the AND gate 212 will be equal the signal on the line 202 and the RAS generator 214 will generate a RAS pulse on a line 218 upon receipt of a refresh pulse, thereby enabling refresh of the addressed row as would normally be the case.

As previously indicated, the refresh address output by the counter 204 is also input to the MUX 207. RAS and CAS addresses from the CPU 14 are also input to the MUX 207, it being understood that the RAS and CAS addresses provide column and row addresses for reading from and writing to the DRAM 20. Because the RAS and CAS addresses are not relevant to the present invention and further because their function and purpose are well known in the art, they are not further described herein. Assuming refresh is not inhibited, the MUX 207 selects the refresh address, which is output by the MUX 207 and input to the DRAM 20 on an address bus 220. The RAS pulse is input to the DRAM 20 to effect a refresh of the row addressed by the refresh address.

Figure 3:
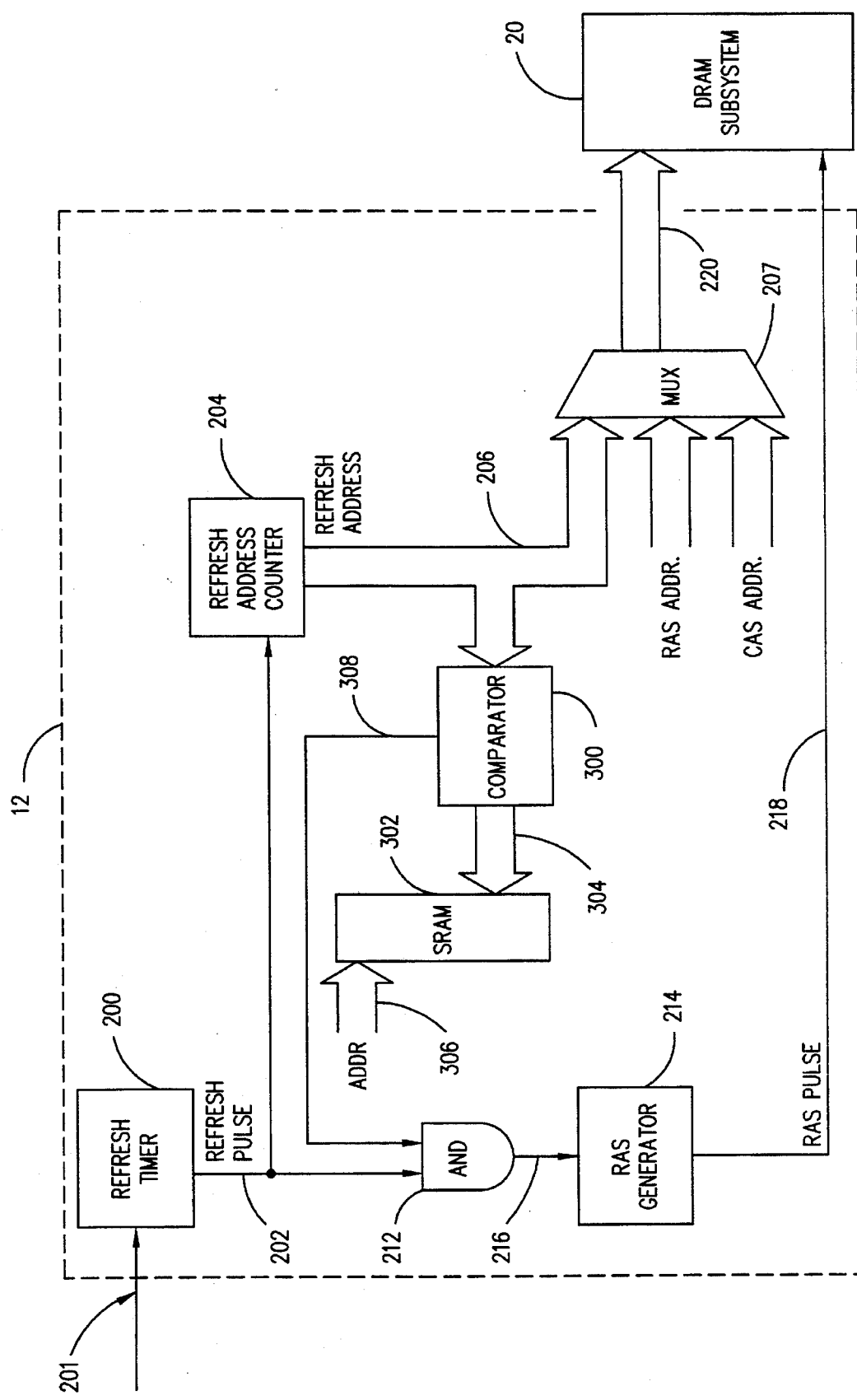
FIG. 3 is an alternative embodiment of the memory controller of FIG. 1.

FIG. 3 illustrates an alternative embodiment of the memory controller of FIG. 1. In this embodiment, the memory controller 12 also comprises a refresh timer 200 for generating refresh pulses to a refresh address generator 204. As in the preferred embodiment, the refresh counter 204 outputs a refresh address on a bus 206, which address is input the MUX 207. In addition, the refresh address is input to a comparator 300, rather than the SRAM 208 as illustrated in FIG. 2. The comparator 300 is connected to an SRAM 302 via a bus 304. Like the SRAM 208 (FIG. 2), the SRAM 302 comprises a plurality of region descriptors for inhibiting refresh of certain portions of DRAM 20; however, each region descriptor of the SRAM 302 comprises a start address and an end address for defining a region (i.e., one or more rows) of DRAM 20 that contains no valid data and in which refresh is to be inhibited.

Once a refresh address has been received by the comparator 300, the region descriptors are sequentially addressed by the CPU 14 using a bus 306 and output to the comparator on the bus 304. The comparator 300 compares the current region descriptor with the refresh address input on the bus 206 and determines whether the refresh address falls within the range defined by the descriptor. If the refresh address falls within a range defined by any one of the region descriptors, i.e., if it is higher than a start address and lower than the corresponding end address of a descriptor, the comparator 300 will output a 0 on a line 304; otherwise, it will output a 1. The output of the comparator 300 is input to one input of the AND gate 212 via the line 308. The other input of the AND gate 212 is connected to receive the refresh pulse from the refresh timer 200 on the line 202. In this manner, the output of the comparator 300 will either enable or inhibit receipt by the RAS generator 214 of the refresh pulse, thereby enabling or inhibiting refresh of the row addressed by the refresh address.

As is the case with the preferred embodiment, the region descriptors are set by logic instructions inserted into the memory allocation and deallocation routines of the operating system of the computer 10. Although not shown, it is understood that the address input of the SRAM 302 would necessarily be multiplexed to enable data to be written to, as well as read from, the SRAM 302.

Figure 4:
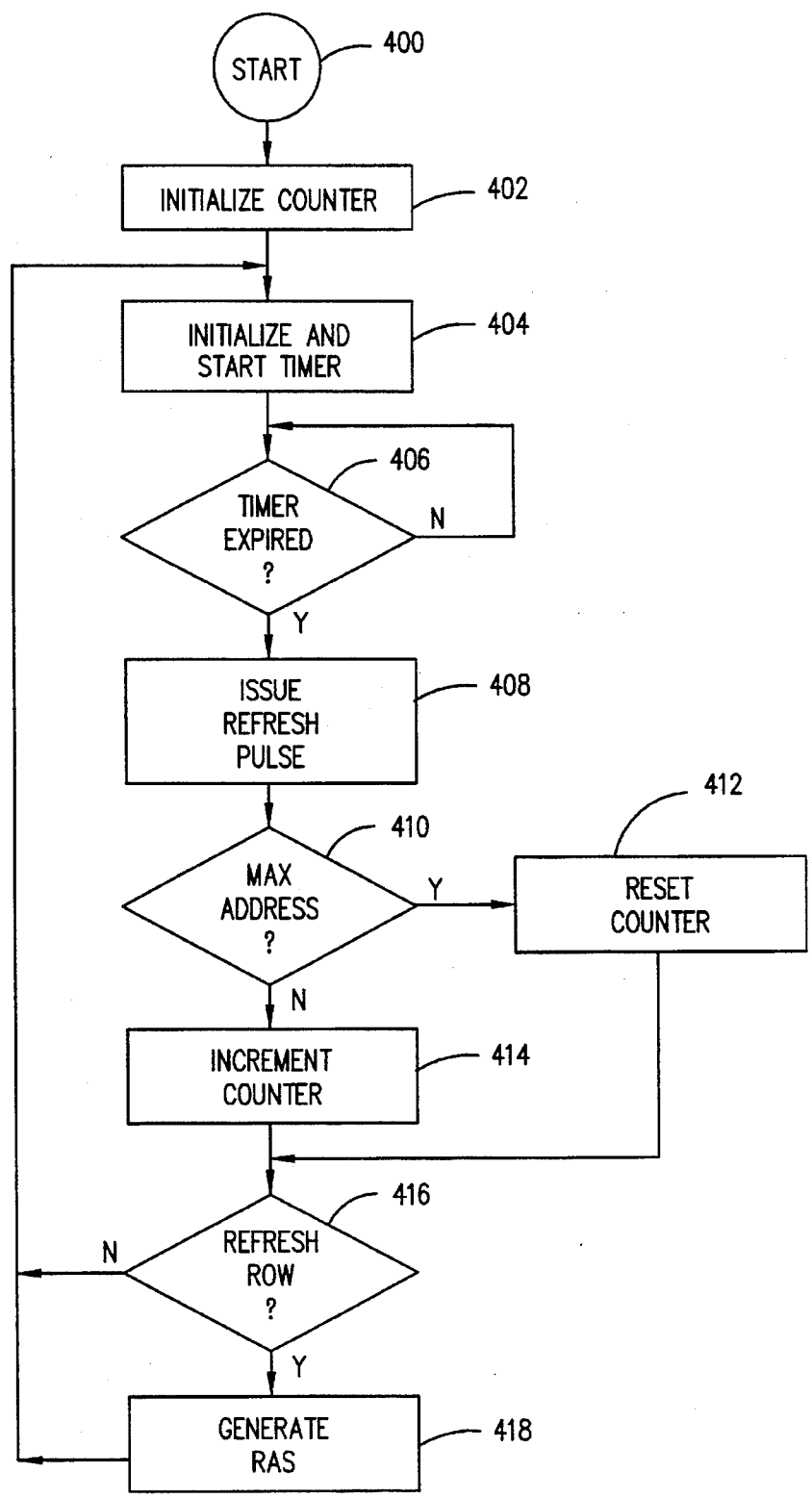
FIG. 4 is a flow chart of the operation of the memory controller of FIG. 2.

FIG. 4 illustrates a flowchart of the operation of the memory controller of FIG. 2. Operation begins at step 400 when power is applied to the computer 10. In step 402, the counter 204 is initialized to the initial value. In step 404, the timer 200 is initialized to a value equal to the refresh period, e.g., 15 microseconds and begins to run. In step 406, a determination is made whether the timer 200 has expired, indicating that the refresh period has elapsed. If in step 406 it is determined that the timer 200 has not expired, execution remains at step 406 until the timer has expired. Otherwise, execution proceeds to step 408, in which the refresh timer 200 issues a refresh pulse.

In step 410, a determination is made whether the counter 204 has reached the maximum value. If in step 410 it is determined that the counter 204 has reached the maximum value, execution proceeds to step 412, in which the counter 204 is reset to the initial value. Execution then proceeds to step 416. If in step 410 it is determined that the counter 204 has not reached the maximum value, execution proceeds to step 414, in which the counter 204 is incremented. Execution then proceeds to step 416.

In step 416, a determination is made whether the row addressed by the refresh address output by the counter 204 is to be refreshed. As previously described, the SRAM 208 will contain a 1 in the location indexed by the refresh address if refresh of the addressed row is to be enabled and a 0 if refresh of the addressed row is to be inhibited. If in step 416 it is determined that the addressed row is not to be refreshed, execution returns to step 404 and the timer 200 is reinitialized and begins again to run. If in step 416 it is determined that the addressed row is to be refreshed, execution proceeds to step 418, in which the RAS generator 214 generates a RAS pulse, and the row addressed by the refresh address is refreshed. Execution then returns to step 404.

Figure 5:
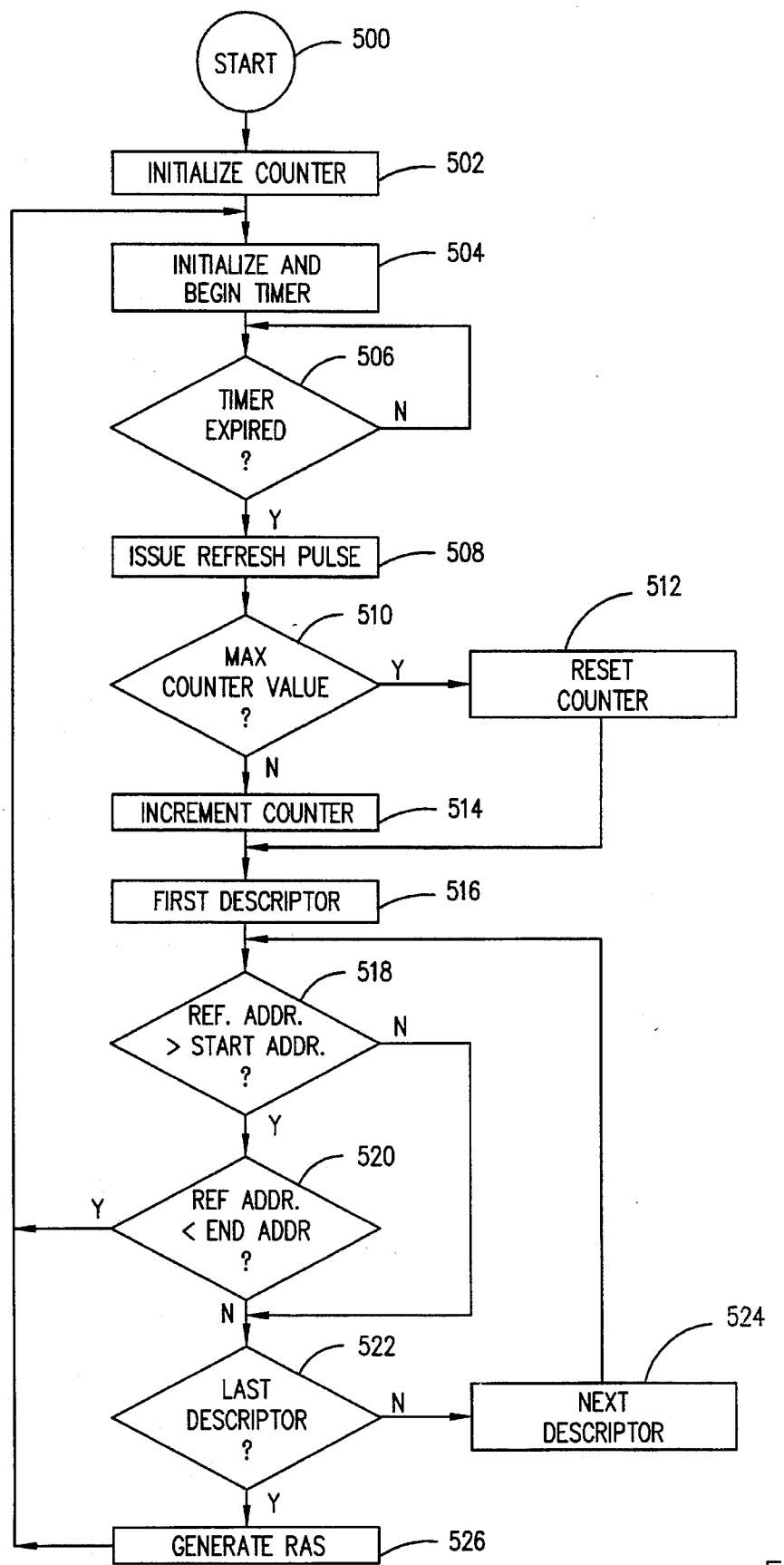
FIG. 5 is a flow chart of the operation of the memory controller of FIG. 3.

FIG. 5 illustrates a flowchart of the operation of the memory controller of FIG. 3. Operation begins in step 500 when power is applied to the computer 10. In step 502, the counter 204 is initialized to the initial value. In step 504, the timer 200 is initialized to the refresh period and begins to run. In step 506, a determination is made whether the timer 200 has expired. If in step 506 it is determined that the timer 200 has not expired, execution remains at step 506 until the timer 200 has expired. Otherwise, execution proceeds to step 508, in which the timer 200 issues a refresh pulse.

In step 510, a determination is made whether the counter has reached the maximum value. If in step 510 it is determined that the counter 204 has reached the maximum value, execution proceeds to step 512, in which the counter 204 is reset to the initial value. Execution then proceeds to step 516. If in step 510 it is determined that the counter 204 has not reached the maximum value, execution proceeds to step 514, in which the counter 204 is incremented. Execution then proceeds to step 516. In step 516, the comparator examines the first descriptor.

In step 518 a determination is made whether the refresh address generated by the counter 204 is greater than the start address of the descriptor. If in step 518 it is determined that the refresh address is greater than the start address of the descriptor, execution proceeds to step 520, in which a determination is made whether the refresh address is less than the end address of the descriptor. If in step 520 it is determined that the refresh address is less than the end address of the descriptor, execution returns to step 504, and the timer is reinitialized and begins again to run. If in step 520 it is determined that the refresh address is not less than the end address of the descriptor, execution proceeds to step 522. If in step 518 it is determined that the refresh address is not greater than the start address of the current descriptor, execution proceeds to step 522.

In step 522, a determination is made whether the current descriptor is the last descriptor to be compared to the refresh address. If in step 522 it is determined that the current descriptor is not the last descriptor, execution proceeds to step 524, in which the next descriptor is examined. From step 524, execution returns to step 518, in which the refresh address is compared with the start address of the new current descriptor. If in step 522 it is determined that the current descriptor is the last descriptor to be compared with the refresh address, execution proceeds to step 526, in which the RAS generator 214 generates a RAS pulse.

It will be understood by persons skilled in the art that, with regard to each row that has not been refreshed for a length of time, at least eight (8) RAS pulses must be applied thereto to rejuvenate the memory cells in that row before those cells may be used for storing data.

While the present invention will result in a significant power savings regardless of the type of DRAM chips used to implement the subsystem 20 or the size of the subsystem 20, the exact figures will obviously be dependent on those factors. For example, if the subsystem 20 is implemented using Micron MT4C4001-80 1MB×4 DRAM chips, which are commercially available from Micron, the average refresh current per row of DRAM will be 500 nA, with an average refresh current per DRAM of 0.256 mA (500 nA×512 rows of DRAM). Assuming further that the subsystem 20 is a bi-32 memory comprising eight (8) such DRAM chips, the average refresh current per row of DRAM will be 4 uA (500 nA×8 chips), with an average refresh current per subsystem 20 of 2.048 mA (0.256 mA×8 chips). Therefore, with regard to this exemplary implementation of the subsystem 20, each row that is not refreshed gives rise to a current savings of 4 uA.

It is understood that the present invention can take many forms and embodiments. The embodiments shown herein are intended to illustrate rather than to limit the invention, it being appreciated that variations may be made without departing from the spirit of the scope of the invention. For example, the region descriptors may comprise masks of the same bit length as the refresh address for defining a region of DRAM that need not be refreshed.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A memory controller for selectively refreshing a dynamic random access memory (DRAM) subsystem of a computer having a central processing unit (CPU) and a memory connected to the CPU, the memory controller connected between the CPU and the DRAM subsystem, the DRAM subsystem having inputs for receiving a refresh address and a refresh request from the memory controller, the refresh address addressing a region of the DRAM subsystem to be refreshed when the refresh request is asserted, the memory controller comprising:

a refresh period timer for generating a refresh pulse upon each expiration of a refresh period;

a refresh address counter connected to said refresh period timer for generating said refresh address to said DRAM subsystem, said refresh address counter advancing said refresh address responsive to receipt of said refresh pulse;

a plurality of region descriptors at least one of which defines a refresh address range in which assertion of said refresh request is to be inhibited; and logic circuitry connected to said refresh period timer for asserting said refresh request to said DRAM subsystem responsive to receipt of said refresh pulse, unless said refresh address falls within said refresh address range defined by said at least one region descriptor.

2. The memory controller of claim 1 further comprising:

logic instructions stored in said memory and executed by said CPU for defining said region descriptors to inhibit assertion of refresh requests for refresh address ranges that do not contain valid data.

3. The memory controller of claim 1 wherein said logic circuitry further comprises:

a refresh address strobe (RAS) generator for generating said refresh request to said DRAM subsystem responsive to receipt of said refresh pulse; and circuitry connected between said refresh period timer and said RAS generator for inhibiting receipt of said refresh pulse by said RAS generator when said refresh address falls within said refresh address range defined by said at least one region descriptors.

4. The memory controller of claim 1 wherein said region of said DRAM subsystem addressed by said refresh address comprises a single row of said DRAM and said refresh request comprises a RAS pulse without a corresponding column address strobe (CAS) pulse.

5. The memory controller of claim 1 wherein the values of said region descriptors are stored in a random access memory device connected to said refresh address counter.

6. The memory controller of claim 1 wherein said region descriptors comprise a one dimensional bit map of said DRAM subsystem.

7. The memory controller of claim 6 wherein said refresh address is input to a memory device connected to said refresh address counter to address one of said region descriptors, said address region descriptor being output from said memory device and input to said logic circuitry for indicating whether said refresh address falls within said refresh address range defined by said at least one region descriptors.

8. The memory controller of claim 1 wherein each of said region descriptors comprises a start address and an end address, said refresh address falling within a refresh address range when said refresh address is greater than or equal to said start address of one of said region descriptors and less than or equal to said end address of said one of said region descriptors.

9. The memory controller of claim 8 further comprising a comparator connected between said refresh address generator and a RAM device connected to said refresh address counter for comparing said refresh address with each of said region descriptors, said comparator generating a signal to said logic circuitry for indicating whether said refresh address falls within said refresh address range defined by said at least one of region descriptors.

10. An apparatus for selectively refreshing a dynamic random access memory (DRAM) subsystem of a computer having a central processing unit (CPU) and a memory connected to the CPU, the apparatus connected between the CPU and the DRAM subsystem, the DRAM subsystem having inputs for receiving a refresh address and a refresh request, wherein the refresh address addresses a region of the DRAM subsystem to be refreshed when the refresh request is asserted, the apparatus comprising:

a refresh period timer for generating a refresh pulse upon each expiration of a refresh period;

a refresh address counter connected to said refresh period timer for generating said refresh address to said DRAM subsystem, said refresh address counter advancing said refresh address responsive to receipt of said refresh pulse;

a random access memory (RAM) device connected to said refresh address counter, said RAM device comprising a plurality of one bit region descriptors at least one of which defines a refresh address range in which assertion of said refresh address is inhibited;

a row address strobe (RAS) generator connected to said DRAM subsystem for asserting said refresh request to said DRAM subsystem responsive to receipt of said refresh pulse; and logic circuitry connected between said refresh timer and said RAM device and said RAS generator for inhibiting receipt by said RAS generator of said refresh pulse when said refresh address falls within said refresh address range defined by said at least one region descriptor.

11. The apparatus of claim 10 further comprising:

logic instructions stored in said memory and executed by said CPU for writing said region descriptors to said RAM device.

12. The apparatus of claim 10 wherein said region of said DRAM subsystem addressed by said refresh address comprises a single row of said DRAM and said refresh request is a row address strobe (RAS) pulse without a corresponding column address strobe (CAS) pulse.

13. The apparatus of claim 10 wherein said RAM device comprises a one dimensional bit map of said DRAM subsystem and each of said region descriptors comprises a single binary bit.

14. The apparatus of claim 13 wherein said refresh address is input to said RAM device to address one of said region descriptors.

15. The apparatus of claim 14 wherein said logic circuitry comprises:

an AND gate having a first input connected to receive said addressed region descriptor, a second input connected to receive said refresh pulse and an output connected to said RAS generator.

16. The apparatus of claim 10 wherein each of said region descriptors comprises a start address and an end address, said refresh address falling within said refresh address range when said refresh address is greater than or equal to said start address of one of said region descriptors and less than or equal to said end address of said one of said region descriptors.

17. An apparatus for selectively refreshing a dynamic random access memory (DRAM) subsystem of a computer having a central processing unit (CPU) and a memory connected to the CPU, the apparatus connected between the CPU and the DRAM subsystem, the DRAM subsystem having inputs for receiving a refresh address and a refresh request, the refresh address addressing a region of the DRAM subsystem to be refreshed when the refresh request is asserted, the apparatus comprising:

means for generating a refresh pulse upon each expiration of a refresh period;

means for generating said refresh address to said DRAM subsystem connected to said refresh pulse generation means, said refresh address being advanced responsive to said refresh pulse;

random access memory (RAM) means connected to said refresh address generation means comprising a plurality of region descriptors, at least one of said region descriptors defining a refresh address range in which assertion of said refresh request is to be inhibited; and logic means connected to said RAM means and said refresh pulse generation means for asserting said refresh request to said DRAM subsystem responsive to receipt of said refresh pulse unless said refresh address falls within said defined refresh address range.

18. The apparatus of claim 17 further comprising:

logic instructions stored in said memory and executed by said CPU for writing said region descriptors to said RAM means.

19. A method of refreshing selected portions of a dynamic random access memory (DRAM) subsystem, said DRAM subsystem having inputs for receiving a refresh address and a refresh request, wherein a row of said DRAM addressed by said refresh address is refreshed when said refresh request is asserted, the method comprising:

issuing a refresh pulse at periodic intervals;

generating a refresh address to said DRAM, said refresh address being advanced responsive to said issued refresh pulse; and comparing said refresh address to a plurality of region descriptors, at least one of which defines a refresh address range in which assertion of said refresh request is to be inhibited; and asserting said refresh request to said DRAM responsive to receipt of said refresh pulse, unless said generated refresh address falls within said refresh address range defined by said at least one region descriptor.

20. The method of claim 19 further comprising:

defining said region descriptors to inhibit assertion of refresh requests for refresh address ranges that do not contain valid data.

* * * * *